US012112888B2

(12) United States Patent
Weis et al.

(10) Patent No.: US 12,112,888 B2
(45) Date of Patent: Oct. 8, 2024

(54) COMPONENT CARRIER WITH CAVITY ACCOMMODATING AT LEAST PART OF DRIVEN BODY BEING MAGNETICALLY DRIVABLE TO MOVE

(71) Applicant: AT&S Austria Technologie & Systemtechnik Aktiengesellschaft, Leoben (AT)

(72) Inventors: Gerald Weis, Bruck an der Mur (AT); Gerald Weidinger, Leoben (AT); Sebastian Sattler, Graz (AT); Patrick Fleischhacker, Graz (AT)

(73) Assignee: AT & S Austria Technologie & Systemtechnik Aktiengesellschaft, Leoben (AT)

( * ) Notice: Subject to any disclaimer, the term of this patent is extended or adjusted under 35 U.S.C. 154(b) by 187 days.

(21) Appl. No.: 17/650,388

(22) Filed: Feb. 9, 2022

(65) Prior Publication Data
US 2022/0254554 A1   Aug. 11, 2022

(30) Foreign Application Priority Data

Feb. 9, 2021   (EP) ..................................... 21156067

(51) Int. Cl.
*H01F 7/02*   (2006.01)
*H01F 41/02*   (2006.01)

(52) U.S. Cl.
CPC ....... *H01F 7/0242* (2013.01); *H01F 41/0253* (2013.01)

(58) Field of Classification Search
CPC ...... H01F 7/0242; H01F 41/0253; H01F 7/02; H01F 7/06; H02K 1/2795; H02K 2211/03;

(Continued)

(56) References Cited

U.S. PATENT DOCUMENTS

2011/0235197 A1* 9/2011 Miyazaki ................. G02B 7/08
                                                           359/824
2013/0236337 A1   9/2013 Gummin et al.
(Continued)

FOREIGN PATENT DOCUMENTS

CN    104467352 A  *  3/2015
EP        3349247 A1    7/2018
(Continued)

OTHER PUBLICATIONS

Zoukas, E.; Extended European Search Report in Application No. 21156067.7; pp. 1-10; Jul. 28, 2021; European Patent Office; 80298, Munich, Germany.

*Primary Examiner* — Mohamad A Musleh
(74) *Attorney, Agent, or Firm* — Robert A. Blaha; Smith Tempel Blaha LLC

(57) ABSTRACT

A drive device includes a component carrier with a stack having at least one electrically conductive layer structure and/or at least one electrically insulating layer structure and a cavity formed in the stack. A driven body is arranged at least partially in the cavity and configured for being drivable to move relative to the component carrier. At least one drive coil for creating a magnetic drive field and at least one drive magnet interacts with the magnetic drive field created by the at least one drive coil to generate a force for moving the driven body relative to the component carrier. One of the at least one drive magnet and the at least one drive coil forms part of the component carrier and the other one of the at least one drive magnet and the at least one drive coil forms part of the driven body.

13 Claims, 3 Drawing Sheets

(58) Field of Classification Search
CPC ............ H02K 3/26; H02K 7/088; H02K 7/09; H02K 11/0094; H02K 11/33; H02K 41/031; H02K 21/24; H02K 7/10; H02K 3/28; H02K 7/06; H02K 15/00; H05K 1/183; H05K 3/368
See application file for complete search history.

(56) References Cited

U.S. PATENT DOCUMENTS

| | | |
|---|---|---|
| 2016/0012950 A1 | 1/2016 | Nishino et al. |
| 2016/0322877 A1 | 11/2016 | Hu |
| 2016/0329799 A1 | 11/2016 | Hofmeister |
| 2019/0179028 A1 | 6/2019 | Pacala et al. |
| 2019/0364217 A1 * | 11/2019 | Sharma .................. H04N 23/45 |

FOREIGN PATENT DOCUMENTS

| | | | | |
|---|---|---|---|---|
| JP | S6035341 A | * | 2/1985 | |
| JP | H07239437 A | * | 9/1995 | |
| JP | 2006345629 A | * | 12/2006 | |
| JP | 2008220066 A | * | 9/2008 | |
| JP | 2013097028 A | * | 5/2013 | |
| KR | 100780148 B1 | * | 11/2007 | |
| WO | WO-9718616 A1 | * | 5/1997 | ............... H02K 1/14 |
| WO | WO-2004086595 A1 | * | 10/2004 | ............... F16C 29/02 |

\* cited by examiner

COMPONENT CARRIER WITH CAVITY ACCOMMODATING AT LEAST PART OF DRIVEN BODY BEING MAGNETICALLY DRIVABLE TO MOVE

CROSS-REFERENCE TO RELATED APPLICATIONS

The present application claims priority to European Patent Application No. 21156067.7 filed Feb. 9, 2021, the disclosure of which is incorporated herein by reference.

TECHNICAL FIELD

The disclosure relates to an electronic device and to a method of manufacturing an electronic device.

TECHNOLOGICAL BACKGROUND

In the context of growing product functionalities of component carriers equipped with one or more components and increasing miniaturization of such components as well as a rising number of components to be connected to the component carriers such as printed circuit boards, increasingly more powerful array-like components or packages having several components are being employed, which have a plurality of contacts or connections, with ever smaller spacing between these contacts. In particular, component carriers shall be mechanically robust and electrically reliable so as to be operable even under harsh conditions.

More and more functions are integrated in a component carrier.

SUMMARY

There may be a need to provide a compact component carrier with extended functionality.

According to an exemplary embodiment of the invention, a drive device is provided which comprises a stack comprising at least one electrically conductive layer structure and/or at least one electrically insulating layer structure and a cavity formed in the stack (and optionally having an opening on at least one side), a driven body arranged at least partially in the cavity and configured for being drivable to move relative to the component carrier, at least one drive coil for creating a magnetic drive field, and at least one drive magnet arranged for interacting with the magnetic drive field created by the at least one drive coil to thereby generate a force for moving the driven body relative to the component carrier, wherein one of the at least one drive magnet and the at least one drive coil forms part of the component carrier and the other one of the at least one drive magnet and the at least one drive coil forms part of the driven body.

According to another exemplary embodiment of the invention, a meth-od of manufacturing a drive device is provided, wherein the method comprises providing a component carrier which comprises a stack comprising at least one electrically conductive layer structure and/or at least one electrically insulating layer structure and a cavity formed in the stack (and option-ally having an opening on at least one side), arranging a driven body at least partially in the cavity and configuring the driven body for being drivable to move relative to the component carrier, providing at least one drive coil for creating a magnetic drive field, providing at least one drive magnet arranged for interacting with the magnetic drive field created by the at least one drive coil to thereby generate a force for moving the driven body relative to the component carrier, arranging one of the at least one drive magnet and the at least one drive coil to form part of the component carrier, and arranging the other one of the at least one drive magnet and the at least one drive coil to form part of the driven body.

Overview of Embodiments

In the context of the present application, the term "drive device" may particularly denote a device configured for generating a mechanical drive force to be supplied to an entity arranged exterior of the drive device itself. The drive device may be configured for converting electric energy into magnetic energy and further into mechanical energy to be used for moving the external entity. For instance, the provided drive force may be a rotary force (i.e., may provide torque to the external entity) and/or may be a longitudinal or linear force (i.e., may provide a directional force to the external entity).

In the context of the present application, the term "component carrier" may particularly denote any support structure which is capable of accommodating one or more components thereon and/or therein for providing mechanical support and/or electrical connectivity. In other words, a component carrier may be configured as a mechanical and/or electronic carrier for components. In particular, a component carrier may be one of a printed circuit board, an organic interposer, and an IC (integrated circuit) substrate. A component carrier may also be a hybrid board combining different ones of the above-mentioned types of component carriers.

In the context of the present application, the term "stack" may particularly denote an arrangement of multiple planar layer structures which are mounted in parallel on top of one another.

In the context of the present application, the term "layer structure" may particularly denote a continuous layer, a patterned layer or a plurality of non-consecutive islands within a common plane.

In the context of the present application, the term "cavity" may particularly denote a hole in the component carrier, in particular a blind hole or a (for instance stepped) through hole. A cavity may be delimited at least partially by a bottom portion of the component carrier and/or may be delimited at least partially by one or more sidewalls of the component carrier, in particular fully circumferentially. It is also possible that the cavity delimited by the component carrier has an at least partially open bottom and/or an at least partially open side.

In the context of the present application, the term "driven body" may particularly denote a device configured to be mechanically driven by the stationary component carrier as a result of a mutual magnetic force exerted between the at least one drive coil and the at least one drive magnet. For instance, the driven body may be a further component carrier.

In the context of the present application, the term "drive coil" may particularly denote an at least partially electrically conductive structure, which may be composed of interconnected electrically conductive elements, defining one or multiple windings. The windings may have a circular shape, a rectangular shape, any other polygonal shape, etc. A coil structure may have the electric function of an electrically conductive coil. The drive coil may be connected to an electric power supply configured for providing an electric current and/or voltage to the drive coil so that a magnetic field is created by the drive coil. For instance, the drive coil may be a helical coil with windings in multiple parallel planes, a planar spiral coil, or a toroid coil.

In the context of the present application, the term "drive magnet" may particularly denote an inlay comprising magnetic material, preferably permanent magnetic material. A drive magnet may be composed of one or multiple connected or spaced magnetic elements. Such one or more magnetic elements may in particular be permanent magnets such as rare earth magnets (i.e., a material with a partially filled 4f shell, in particular neodymium) or permanent magnetic transition metals (i.e., a material with a partially filled 3d shell, for example iron, cobalt or nickel). A magnetic force may be exerted to a functional pair composed of at least one drive magnet and at least one drive coil, wherein said magnetic force may create a drive force provided by the drive device. In embodiments, a drive magnet may even be a powered coil or electromagnet.

According to an exemplary embodiment of the invention, a drive device is provided which is composed of a component carrier and a driven body located partially or entirely in a cavity of the component carrier. One or more drive coils and one or more drive magnets of the component carrier and/or driven body, respectively, may cooperate to generate a mutual magnetic force when an electric drive current or voltage is applied to flow through the at least one drive coil. When the component carrier and the driven body are configured so as to be mutually movable relative to each other, the created magnetic force may result in a motion of the driven body (such as a rotating and/or linearly moving and/or reciprocating body, while the component carrier may remain stationary) which may be used as a mechanical drive force, for instance for driving an external entity. Highly advantageously, the driven body may be located partially or entirely within the cavity of the component carrier so that an extremely flat and compact design is achieved in particular in a vertical direction. Thus, a drive device according to an exemplary embodiment of the invention may be implemented particularly advantageously in applications with strictly limited space availability in a vertical direction.

In the following, further exemplary embodiments of the drive device and the method will be explained.

In an embodiment, the at least one drive coil forms part of the component carrier and the at least one drive magnet forms part of the driven body. This allows to configure the driven body as a completely passive member without the need to supply any electric signals to the driven body. This is particularly advantageous, since supplying an electric signal to a rotating or reciprocating driven body may involve significantly larger technical effort than supplying such an electric drive signal to a stationary component carrier.

In alternative embodiments, the at least one drive coil is embedded and/or formed in the driven body, whereas the at least one drive magnet is embedded in the component carrier. In this case, an electric excitation signal for exciting the at least one drive coil may need to be applied to a movable body, i.e., the driven body. For instance, this may be accomplished by one or more sliding electric contacts. Hence, in an alternative embodiment, it may be possible to embed a drive coil in the driven body, for instance using a sliding electric contact or by transmitting electromagnetic radiation to the driven body which is then converted into an electric signal within the driven body.

In yet another embodiment, both the component carrier and the driven body may each comprise at least one drive coil and at least one drive magnet. This may allow to fine-tune the performance of the drive device, for instance may smoothen the motion of the driven body.

In an embodiment, at least part of the at least one drive coil forms part of the at least one electrically conductive layer structure. Hence, the anyway present electrically conductive layer structures may be configured and connected so as to be the constituents of one or more drive coils. For example, a patterned metal layer (such as a metal foil or a deposited metal layer) may form one winding of such a drive coil, wherein different windings in different planes of the stack may be interconnected by vertical through connections (in particular metallic vias) to form a coil. This may allow to manufacture the one or more drive coils with low effort.

In an embodiment, multiple windings of the at least one drive coil are circumferential horizontal electrically conductive structures being vertically stacked within the component carrier. Said circumferential horizontal electrically conductive structures may be interconnected (for instance for forming a substantially helical structure) by vertical electrically conductive structures, such as copper filled laser vias. In other words, each winding may be located substantially within one horizontal plane. Different windings may lie in parallel planes. Such a design of the drive coil(s) is properly compatible with printed circuit board (PCB) technology which may be used for providing the component carrier. The described drive coil may be configured as cylindrical coil. In other embodiments, it may also be possible to form at least one of the at least one drive coil as toroid coil or as a spiral planar coil.

In an embodiment, the at least one drive coil is embedded in the component carrier, and the at least one drive magnet is embedded in the driven body. In particular, metallic structures (for instance made of copper) may be embedded in the component carrier and may be configured to function as a coil. Such an embodiment is particularly preferred, since it may allow to provide the driven body without any active electronic members and thus without any electric cables or wires. Only the component carrier may then need to be contacted with an electric cable or wire in order to supply an electric excitation signal (such an AC (alternating current) signal, which may for instance have any of the following waveforms: rectangular, triangular, sinusoidal) for operating the one or more drive coils. This may significantly simplify construction of the drive device.

Advantageously, a magnetic core may be arranged in an opening of the at least one drive coil. Such a magnetic core may for instance be embodied as a magnetic inlay. Such a magnetic core may function to increase the magnetic field and thus the inductance of the drive coil. For example, such a magnetic core may comprise or consist of iron and/or ferrite.

In an embodiment, the driven body is plate-shaped, in particular is a further component carrier. For instance, each of the component carrier and the driven body may be embodied as a respective printed circuit board (PCB) or as a part of a PCB. Consequently, a highly compact design of the entire drive device may be achieved. Descriptively speaking, one plate (i.e., the driven body) may be arranged partially or entirely within a recess of another plate (i.e., the component carrier) for forming the drive device. Thus, an ultra-flat drive device may be provided.

In an embodiment, the driven body is configured for being driven to rotate relative to the component carrier. When the at least one drive coil is excited with an electric exciting signal, the at least one drive coil will create a time-varying magnetic field and will thereby exert a time-varying magnetic force to the at least one drive magnet. By appropriately controlling the time dependence of the electric exciting signal, it may be possible to force the driven body to rotate about the component carrier with a definable motion profile following a definable excitation signal profile. The rotational movement of the driven body may be based on attractive and/or repulsive forces that are exerted by the magnetic fields of drive coil(s) and/or drive magnet(s) on each other (Lorentz force). For example, a drive shaft connected to the driven body may be rotated in this way. Corresponding embodiments are illustrated for example in FIG. 1 to FIG. 3, and FIG. 5.

In another embodiment, the driven body is configured for being driven to move linearly, in particular to reciprocate, relative to the component carrier. Unlike a rotating drive device according to the previously described embodiment, a drive device according to another exemplary embodiment of the invention may be configured as a linear motor which does not put the driven body into a rotating motion, but pushes the driven body for example on a straight or curved path. In one embodiment, the driven body may be moved linearly within the cavity. In another embodiment, the driven body may even extend beyond or move out of the cavity when being moved by the electric force created by powering the one or more drive coils. For instance, a reciprocating piston or any other actuator being actuated in a linear rather than rotating fashion may be operated in this way. Such an embodiment is shown for instance in FIG. 4.

In an embodiment, the at least one drive magnet is a permanent magnet (for instance a ferromagnet or a ferrimagnet), in particular a rare earth magnet. Rare earth magnets, for instance made of neodymium, have the advantage of a particularly high magnetic strength so that a high drive force may be achieved.

In an embodiment, the driven body is arranged entirely in the cavity or partially extends beyond the cavity.

For example, an upper main surface of the component carrier and an upper main surface of the driven body may be aligned or may be in flush with each other. It may even be possible that the driven body is retracted into the cavity so that a recess of the drive device remains when the driven body is accommodated fully inside of the cavity.

Alternatively, the driven body may partially protrude beyond the cavity. While such a configuration still provides a drive device being highly compact in vertical direction, a drive body protruding beyond the cavity may simplify exerting a created mechanical drive force to an exterior entity. For example, a created rotary force of the driven body may drive an external eccentric shaft which may for example exert a pumping motion onto a squeezable tube of a peristaltic pump (for instance for supplying a controlled insulin flow). In another embodiment, a created longitudinal force of the driven body may drive an external reciprocating shaft of a piston pump (for instance for supplying a controlled flow of a solvent composition or of oil).

In an embodiment, the driven body is configured to temporarily move at least partially out of the cavity, in particular for mechanically actuating an external entity, when said force for moving the driven body relative to the component carrier is exerted. The magnetic force exerted to the driven body may thus elongate the driven body out of its default position in the cavity so that the driven body may function as an actuator. For example, the driven body itself may operate as a (for instance reciprocating) piston, for instance of a piston pump. Alternatively, the driven body may actuate an external entity such as a squeezable tube of a peristaltic pump.

In an embodiment, the drive device comprises at least one component, in particular an electronic component, being surface mounted on and/or embedded in the driven body and being configured for generating operation energy based on the magnetic drive field. In the context of the present application, the term "electronic component" may particularly denote a component fulfilling an electronic task. For instance, such an electronic component may be a semiconductor chip comprising a semiconductor material, in particular as a primary or basic material. In particular, the semiconductor component may be a semiconductor chip such as a naked die or a molded die. For instance, the embedded component may comprise an antenna configured for capturing electromagnetic radiation transmitted from the at least one drive coil, and configured for converting said magnetic energy into electrical energy which may be used for operating the electronic component. For example, the components may be arranged to have an optimized rotating force with balanced masses for preventing eccentric artefacts of the rotor. Alternatively, the components may be arranged with (in particular intentionally) non-optimized rotating force characteristics, for instance to carry out an eccentric operation.

In an embodiment, the drive device comprises at least one bearing by which the driven body is movably mounted on the component carrier. Preferably, a bearing is provided for defining a spatial relationship between component carrier and driven body while enabling a mutual motion between component carrier and driven body. In particular, the bearing may define a guided motion trajectory enabled between component carrier and driven body. For instance, such a bearing may be defined by a central bearing extending along a central bearing axis and extending through both component carrier and driven body, may be arranged along an exterior perimeter of the driven body facing the component carrier at the lateral position, etc. Such a bearing may for example be a magnetic bearing (i.e., exerting a magnetic bearing force) or a mechanical bearing (such as a friction bearing or a roller or ball bearing).

As already mentioned, the at least one bearing may comprise a magnetic bearing comprising cooperating bearing magnets of the component carrier and of the driven body. For instance, such a magnetic bearing may be composed of pairs of mutually interacting bearing magnets embedded in and/or surface mounted on both component carrier and driven body in mutually facing surface portions. For example, such bearing magnets may create a mutually attractive force for maintaining component carrier and driven body in mutual spatial relationship, in particular laterally. Additionally or alternatively, it is also possible to provide mutually repulsive bearing magnets in component carrier and driven body to create a mutually repulsive force for maintaining component carrier and driven body in mutual spatial relationship, in particular vertically spaced.

As mentioned above as well, the at least one bearing may comprise a mechanical bearing, in particular a roller bearing (for instance a ball bearing). For instance, one or more balls may be interposed along an exterior perimeter of the driven body and along an interior perimeter delimiting the cavity of the component carrier. For example, semi-spherical recesses may be formed in each of the facing side walls of driven body and component carrier, so that the one or more bearing balls may be accommodated in said semi-spherical recesses.

In an embodiment, at least one of the at least one bearing is configured for operating with a lateral bearing force (or may act laterally, i.e., within a horizontal plane). In other words, the bearing force may be orientated within a horizontal plane so thereby adjust a lateral mutual distance between the component carrier and the driven body. This may be achieved for example by an arrangement of balls of a ball bearing located within a horizontal plane or by magnets in driven body and component carrier positioned within a common horizontal plane.

Additionally or alternatively, at least one of the at least one bearing may be configured for operating with a vertical bearing force (or may act vertically). For example, repulsive magnets may be arranged in both the driven body and the component carrier so as to maintain a vertical spacing between driven body and component carrier for promoting a low-friction mutual motion.

For instance, one of the at least one bearing can be a bearing acting laterally and another bearing can act vertically in the same device.

In an embodiment, the drive device comprises a drive shaft extending (in particular vertically) through the component carrier and through the driven body and being configured for moving (in particular rotating) together with the driven body and relative to the component carrier. For instance, the drive shaft may be fixedly connected with the driven body while being rotatably connected to the component carrier by a bearing. With such a configuration, a mechanically robust drive device may be provided which enables the application of torque to the drive shaft which may be connected, in turn, to an external entity to be rotated.

In exemplary embodiments, the rotor can form an inner part or an outer part of the device. For instance, a stationary PCB may be arranged to be not drivable, and a surrounding PCB may function as rotor.

In an embodiment, the component carrier is shaped as a plate. This contributes to the compact design, wherein the component carrier nevertheless provides a large basis for mounting components thereon. Furthermore, in particular a naked die as example for an embedded electronic component, can be conveniently embedded, thanks to its small thickness, into a thin plate such as a printed circuit board.

In an embodiment, the component carrier is configured as one of the group consisting of a printed circuit board, a substrate (in particular an IC substrate), and an interposer.

In the context of the present application, the term "printed circuit board" (PCB) may particularly denote a plate-shaped component carrier which is formed by laminating several electrically conductive layer structures with several electrically insulating layer structures, for instance by applying pressure and/or by the supply of thermal energy. As preferred materials for PCB technology, the electrically conductive layer structures are made of copper, whereas the electrically insulating layer structures may comprise resin and/or glass fibers, so-called prepreg or FR4 material. The various electrically conductive layer structures may be connected to one another in a desired way by forming holes through the laminate, for instance by laser drilling or mechanical drilling, and by partially or fully filling them with electrically conductive material (in particular copper), thereby forming vias or any other through-hole connections. The filled hole either connects the whole stack, (through-hole connections extending through several layers or the entire stack), or the filled hole connects at least two electrically conductive layers, called via. Similarly, optical interconnections can be formed through individual layers of the stack in order to receive an electro-optical circuit board (EOCB). Apart from one or more components which may be embedded in a printed circuit board, a printed circuit board is usually configured for accommodating one or more components on one or both opposing surfaces of the plate-shaped printed circuit board. They may be connected to the respective main surface by soldering. A dielectric part of a PCB may be composed of resin with reinforcing fibers (such as glass fibers).

In the context of the present application, the term "substrate" may particularly denote a small component carrier. A substrate may be a, in relation to a PCB, comparably small component carrier onto which one or more components may be mounted and that may act as a connection medium between one or more chip(s) and a further PCB. For instance, a substrate may have substantially the same size as a component (in particular an electronic component) to be mounted thereon (for instance in case of a Chip Scale Package (CSP)). More specifically, a substrate can be understood as a carrier for electrical connections or electrical networks as well as component carrier comparable to a printed circuit board (PCB), however with a considerably higher density of laterally and/or vertically arranged connections. Lateral connections are for example conductive paths, whereas vertical connections may be for example drill holes. These lateral and/or vertical connections are arranged within the substrate and can be used to provide electrical, thermal and/or mechanical connections of housed components or unhoused components (such as bare dies), particularly of IC chips, with a printed circuit board or intermediate printed circuit board. Thus, the term "substrate" also includes "IC substrates". A dielectric part of a substrate may be composed of resin with reinforcing particles (such as reinforcing spheres, in particular glass spheres).

The substrate or interposer may comprise or consist of at least a layer of glass, silicon (Si) and/or a photoimageable or dry-etchable organic material like epoxy-based build-up material (such as epoxy-based build-up film) or polymer compounds (which may or may not include photo- and/or thermosensitive molecules) like polyimide or polybenzoxazole.

In an embodiment, the at least one electrically insulating layer structure comprises at least one of the group consisting of a resin or a polymer, such as epoxy resin, cyanate ester resin, benzocyclobutene resin, bismaleimide-triazine resin, polyphenylene derivate (e.g., based on polyphenylenether (PPE), polyimide (PI), polyamide (PA), liquid crystal polymer (LCP), polytetrafluoroethylene (PTFE) and/or a combination thereof. Reinforcing structures such as webs, fibers, spheres or other kinds of filler particles, for example made of glass (multilayer glass) in order to form a composite, could be used as well. A semi-cured resin in combination with a reinforcing agent, e.g., fibers impregnated with the above-mentioned resins is called prepreg. These prepregs are often named after their properties, e.g., FR4 or FR5, which describe their flame retardant properties. Although prepreg particularly FR4 are usually preferred for rigid PCBs, other materials, in particular epoxy-based build-up materials (such as build-up films) or photoimageable dielectric materials, may be used as well. For high frequency applications, high-frequency materials such as polytetrafluoroethylene, liquid crystal polymer and/or cyanate ester resins, may be preferred. Besides these polymers, low temperature cofired ceramics (LTCC) or other low, very low or ultra-low DK materials may be applied in the component carrier as electrically insulating structures.

In an embodiment, the at least one electrically conductive layer structure comprises at least one of the group consisting of copper, aluminum, nickel, silver, gold, palladium, tungsten and magnesium. Although copper is usually preferred, other materials or coated versions thereof are possible as well, in particular coated with supra-conductive material or conductive polymers, such as graphene or poly(3,4-ethylenedioxythiophene) (PEDOT), respectively.

At least one component may be embedded in the component carrier and/or may be surface mounted on the component carrier. Such a component can be selected from a group consisting of an electrically non-conductive inlay, an electrically conductive inlay (such as a metal inlay, preferably comprising copper or aluminum), a heat transfer unit (for example a heat pipe), a light guiding element (for example an optical waveguide or a light conductor connection), an electronic component, or combinations thereof. An inlay can be for instance a metal block, with or without an insulating material coating (IMS-inlay), which could be either embedded or surface mounted for the purpose of facilitating heat dissipation. Suitable materials are defined according to their thermal conductivity, which should be at least 2 W/mK. Such materials are often based, but not limited to metals, metal-oxides and/or ceramics as for instance copper, aluminum oxide ($Al_2O_3$) or aluminum nitride (AlN). In order to increase the heat ex-change capacity, other geometries with increased surface area are frequently used as well. Furthermore, a component can be an active electronic component (having at least one p-n-junction implemented), a passive electronic component such as a resistor, an inductance, or capacitor, an electronic chip, a storage device (for instance a DRAM or another data memory), a filter, an integrated circuit (such as field-programmable gate array (FPGA), programmable array logic (PAL), generic array logic (GAL) and complex programmable logic devices (CPLDs)), a signal processing component, a power management component (such as a field-effect transistor (FET), metal-oxide semiconductor field-effect transistor (MOSFET), complementary metal-oxide semiconductor (CMOS), junction field-effect transistor (JFET), or insulated-gate field-effect transistor (IGFET), all based on semi-conductor materials such as silicon carbide (SiC), gallium arsenide (GaAs), gallium nitride (GaN), gallium oxide ($Ga_2O_3$), indium gallium arsenide (InGaAs) and/or any other suitable inorganic compound), an optoelectronic interface element, a light emitting diode, a photocoupler, a voltage converter (for example a DC/DC converter or an AC/DC converter), a cryptographic component, a transmitter and/or receiver, an electromechanical transducer, a sensor, an actuator, a microelectromechanical system (MEMS), a microprocessor, a capacitor, a resistor, an inductance, a battery, a switch, a camera, an antenna, a logic chip, and an energy harvesting unit. However, other components may be embedded in the component carrier. For example, a magnetic element can be used as a component. Such a magnetic element may be a permanent magnetic element (such as a ferromagnetic element, an antiferromagnetic element, a multiferroic element or a ferrimagnetic element, for instance a ferrite core) or may be a paramagnetic element. The magnetic element can be composed by magnetic particles distributed in a polymer matrix. Such materials may be provided as printable paste or as sheet materials in B-stage and C-stage form. However, the component may also be an IC substrate, an interposer or a further component carrier, for example in a board-in-board configuration. The component may be surface mounted on the component carrier and/or may be embedded in an interior thereof. Moreover, also other components, in particular those which generate and emit electromagnetic radiation and/or are sensitive with regard to electromagnetic radiation propagating from an environment, may be used as component.

In an embodiment, the component carrier is a laminate-type component carrier. In such an embodiment, the component carrier is a compound of multiple layer structures which are stacked and connected together by applying a pressing force and/or heat.

After processing interior layer structures of the component carrier, it is possible to cover (in particular by lamination) one or both opposing main surfaces of the processed layer structures symmetrically or asymmetrically with one or more further electrically insulating layer structures and/or electrically conductive layer structures. In other words, a build-up may be continued until a desired number of layers is obtained.

After having completed formation of a stack of electrically insulating layer structures and electrically conductive layer structures, it is possible to proceed with a surface treatment of the obtained layers structures or component carrier.

In particular, an electrically insulating solder resist may be applied to one or both opposing main surfaces of the layer stack or component carrier in terms of surface treatment. For instance, it is possible to form such a solder resist on an entire main surface and to subsequently pattern the layer of solder resist so as to expose one or more electrically conductive surface portions which shall be used for electrically coupling the component carrier to an electronic periphery. The surface portions of the component carrier remaining covered with solder resist may be efficiently protected against oxidation or corrosion, in particular surface portions containing copper.

It is also possible to apply a surface finish selectively to exposed electrically conductive surface portions of the component carrier in terms of surface treatment. Such a surface finish may be an electrically conductive cover material on exposed electrically conductive layer structures (such as pads, conductive tracks, etc., in particular comprising or consisting of copper) on a surface of a component carrier. If such exposed electrically conductive layer structures are left unprotected, then the exposed electrically conductive component carrier material (in particular copper) might oxidize, making the component carrier less reliable. A surface finish may then be formed for instance as an interface between a surface mounted component and the component carrier. The surface finish has the function to protect the exposed electrically conductive layer structures (in particular copper circuitry) and enable a joining process with one or more components, for instance by soldering. Examples for appropriate materials for a surface finish are Organic Solderability Preservative (OSP), Electroless Nickel Immersion Gold (ENIG), Electroless Nickel Immersion Palladium Immersion Gold (ENIPIG), gold (in particular hard gold), chemical tin, nickel-gold, nickel-palladium, etc.

The aspects defined above and further aspects of the invention are apparent from the examples of embodiment to be described hereinafter and are explained with reference to these examples of embodiment.

DETAILED DESCRIPTION OF ILLUSTRATED EMBODIMENTS

Figure 1:
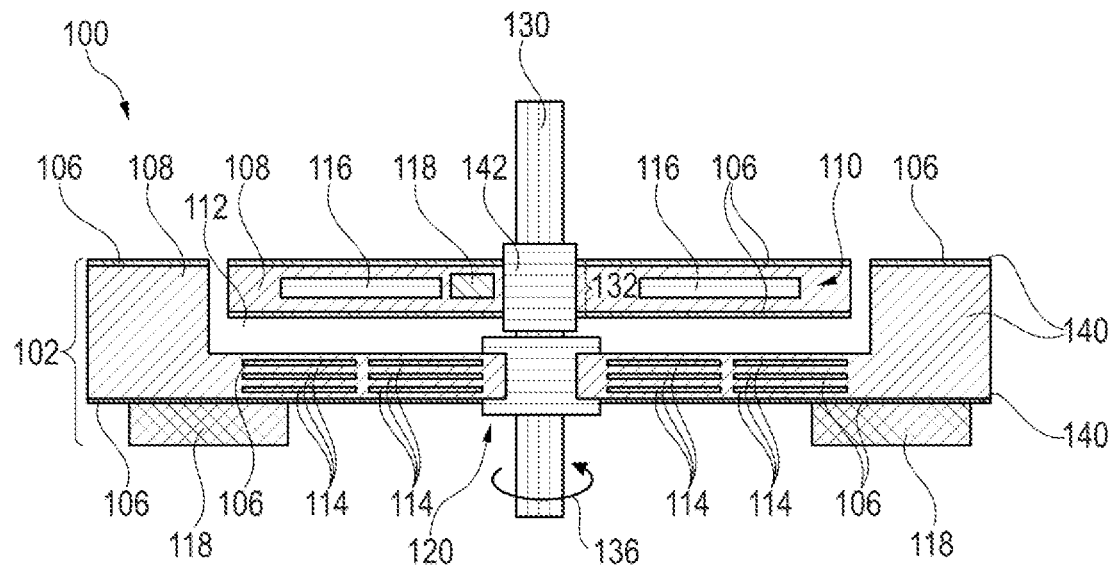
FIG. 1 illustrates a drive device providing torque by magnetically rotating a driven body arranged within a cavity of a component carrier according to an exemplary embodiment of the invention, wherein an embedded component is supplied with wirelessly transmitted electromagnetic energy.

The illustrations in the drawings are schematically presented. In different drawings, similar or identical elements are provided with the same reference signs.

Before, referring to the drawings, exemplary embodiments will be described in further detail, some basic considerations will be summarized based on which exemplary embodiments of the invention have been developed.

According to an exemplary embodiment of the invention, a drive device is provided in which a driven body is moved relative to a component carrier (such as a printed circuit board, PCB) by the cooperating function of at least one drive coil and at least one driven magnet. Preferably, the one or more active drive coils are located within the stationary component carrier, whereas the one or more passive drive magnets are embedded in the driven body (or vice versa). When an electric excitation signal (for instance an alternating current) is applied to the at least one drive coil of the component carrier, a magnetic field is created which moves the at least one drive magnet of the driven body due to the Lorentz force. Consequently, the driven body may be moved relative to the component carrier by the mechanical force generated on the basis of the magnetic force, which is generated, in turn, by an electric drive signal. When positioning the driven body within a cavity of the component carrier, the drive device may be formed extremely flat. Thus, a highly compact micromotor may be provided with low effort.

For example, a thickness of the component carrier may be in a range from 0.3 mm to 3 mm, in particular in a range from 0.5 mm to 2 mm. An area of the drive device in a horizontal plane may be for example in a range from 10 mm$^2$ to 1000 mm$^2$, in particular from 15 mm$^2$ to 100 mm$^2$, for instance from 16 mm$^2$ to 20 mm$^2$.

Advantageously, the number of drive coils embedded in particular in the component carrier may be freely selected without adding additional manufacturing effort, complexity or space consumption. Descriptively speaking, non-used or non-functional regions of the layer stack of the component carrier may be selected for embedding coil structures for fine-tuning the engine functionality of the drive device. The larger the number of drive coils, the more precisely can the motion characteristics of the drive device be adjusted. For instance, a 1-phase motor may be constructed with a smaller number of drive coils as compared to a 3-phase motor or even a 12-phase motor requiring a larger number of drive coils. In particular, providing a plurality of drive coils may allow to embody the drive device as step motor. The more phases (i.e., the more drive coils), the smoother will the engine run. The number of phases can be enlarged further to provide a stepper motor.

Exemplary applications of exemplary embodiments of the invention are micro-motors based on embedded magnets in a PCB. For instance, an insulin pump or an oil pump may be constructed on the basis of such a drive device. Other applications of exemplary embodiments are micro-actuators, micro-adjustment tools, flat stepping motors, high accuracy positioning systems, and a camera zoom (wherein the drive device may perform a lens control). A shutter of a camera (in particular speed dependent) is a further possible application.

According to an exemplary embodiment of the invention, a drive de-vice may be provided which may be embodied as micromotor. An exemplary embodiment may combine one or several electromagnets in a stator and one or more magnetic elements (such as hard magnetic bodies or permanent magnetic bodies) in a rotor. Advantageously, PCB technology can be used to achieve a drive device which may operate as thin spinning wheel or linear moving construction. By electrically conductive structures (in particular made of copper) of the PCB, a coil structure (as an example for a drive coil) can be easily formed with traces or polygons and vias. By embedding permanent magnetic material in the rotor and/or the stator, it may be possible to construct the drive device to operate as a motor. Preferably, the stator is a component carrier such as a PCB. Moreover, also the moving part of the motor-type drive device may be embodied as a further PCB. As a result, a drive device with very small dimension in vertical direction may be obtained.

For mechanically driving the constituents of the motor-type drive device in a controlled or guided way, it may be possible to implement a bearing (in particular a low-friction bearing) between component carrier and driven body. In one embodiment, such a bearing may be formed on a common shaft connected to both the component carrier and the driven body. Additionally or alternatively, a bearing may be accommodated in an air gap between the rotor (for instance the driven body) and the stator (for example the component carrier). As a bearing, a ball bearing may be implemented. It is also possible to embody a bearing of the drive device as rolling contact bearing or friction bearing. In a preferred embodiment, it may be possible to embed additional permanent magnetic material or electromagnets in one or both of the component carrier and the driven body to keep the moving part in position.

In an embodiment, embedding technology may be used to place one or more pre-fabricated permanent magnetic material inlays into inner layers of a PCB-type component carrier. The board or component carrier with the embedded parts may form a rotor or a stator of a drive device according to an exemplary embodiment of the invention, which may function as a magnetic motor. Preferably, the part with the inlay(s) may be implemented as the moving part, i.e., the rotor. The complementary part (which may also be denoted as the stator) may comprise or consist of electromagnets formed by a conductive structure of a PCB-type component carrier. Vias can be filled with copper or other electrically conductive materials to realize connections between the layers, thereby forming one or more drive coils. To enhance the electromagnet function, a soft magnetic material with surrounding windings may be preferred as one or more drive coil. For such an embodiment, the soft magnetic material may also be embodied as an embedded inlay.

An exemplary embodiment of the drive device is a motor providing torque. In another embodiment, a drive device may be provided which may realize the function of a linear motor. In such an embodiment, the driven body may be a slider moving along the length of the stator-type component carrier.

In an exemplary embodiment, it may be possible to embed permanent magnetic material inside a PCB in combination with moving parts and bearings. Embedding of permanent magnets may contribute to a miniaturization of the drive device as a whole. For the magnetic elements, it may be possible to embed the magnetic core material in the inner layers of the PCB-type component carrier. The orientation of the coils may be horizontal, and the coil may wind vertically over a core. Advantageously, one or more magnetic cores may be oriented horizontal, and the coil may wind vertically over such a core. If the magnetic elements are permanent magnets, they may be embedded as well. By taking these measures, the compactness of the drive device may be further enhanced. Permanent magnets may be combined with a coil-based magnet to create the motor.

By embedding, the permanent magnetic material used for the motion generation of the motor-type drive device may be assembled in the moving part of the motor which may also be a PCB-type component carrier. This may further contribute to the compact character of the drive device.

FIG. 1 illustrates a drive device 100 providing torque by magnetically rotating a driven body 110 arranged within a cavity 112 of a component carrier 102 according to an exemplary embodiment of the invention. As shown in FIG. 1, cavity 112 has an opening on an upper side. According to FIG. 1, an embedded component 118 is supplied with wirelessly transmitted electromagnetic energy. Moreover, further surface mounted components 118 are provided which may control an electric field.

The component carrier 102 is here embodied as a flat plate-shaped printed circuit board (PCB). In the shown embodiment, the component carrier 102 functions as a stator, i.e., remains stationary or spatially fixed during operation of the drive device 100. The component carrier 102 comprises a laminated layer stack 140 made of a plurality of electrically conductive layer structure 106 and one or a plurality of electrically insulating layer structures 108. As shown, cavity 112 is formed as a blind hole or recess in an upper portion of the stack 140. For example, the cavity 112 may be created as described below referring to FIG. 6 to FIG. 8.

FIG. 1 also shows that one or more components 118 may be surface mounted on (and/or embedded in) the stack 140. For example, such one or more components 118 may be electrically coupled with drive coils 114, for instance for supplying them with an electric drive signal. It is also possible that such a component 118 functions as an energy supply, for instance is an accumulator or a battery. It is also possible that a component 118 acts as control circuitry.

A further constituent of the drive device 100 is the driven body 110 which is located in the cavity 112 and is configured for being driven to rotate relative to the component carrier 102. Thus, the driven body 112 functions as a rotor, i.e., rotates during operation of the drive device 100. In the shown embodiment, also the driven body 110 is a plate-shaped further component carrier, here embodied as a further printed circuit board (PCB). The driven body 110 comprises a further laminated layer stack 132 which is also made of a plurality of electrically conductive layer structures 106 and one or a plurality of electrically insulating layer structures 108.

As already mentioned, the laminated stacks 140, 132 are composed of electrically conductive layer structures 106 and electrically insulating layer structures 108. For example, the electrically conductive layer structures 106 may comprise patterned copper foils (and optionally one or more vertical through connections, for example copper filled laser vias). The electrically insulating layer structures 108 may comprise a resin (such as epoxy resin), optionally comprising reinforcing particles therein (for instance glass fibers or glass spheres). For instance, the electrically insulating layer structures 108 may be made of prepreg or FR4. The layer structures 106, 108 may be connected by lamination, i.e., the application of pressure and/or heat.

As shown as well in FIG. 1, drive coils 114 are embedded in the stack 140 of the component carrier 102. The drive coils 114 are configured for creating a magnetic drive field when being excited by an electric drive signal such as an alternating current (AC) signal which may here be provided by an external current source and/or by the surface mounted (alternatively embedded) electronic components 118 of the component carrier 102. Advantageously, the drive coils 114 form part of the stationary component carrier 102 which simplifies the supply of the exciting electric drive signal. Moreover, the drive coils 114 may be created as part of the electrically conductive layer structures 106. More specifically, each winding of each drive coil 114 may be formed as circumferential horizontal structures lying in a respective horizontal plane of the stack 140. For example, each winding may be formed by a respective patterned copper layer within stack 140. In particular, each winding may be an open annular structure. Adjacent windings in adjacent vertically spaced planes may be interconnected by vertical through connections (not shown), such as copper filled laser vias. As shown, windings of a respective drive coil 114 are vertically stacked within the component carrier 102. This simplifies manufacture of the drive coils 114 by standard PCB processes such as plating or laminating and patterning layers for forming the windings, as well as drilling and plating through holes for interconnecting different windings. By embedding the drive coils 114 in the component carrier 102 using standard PCB processes, a highly compact drive device 100 may be obtained with low effort.

As can be taken from FIG. 1 as well, a plurality of drive magnets 116 are embedded in the PCB-type driven body 110. Preferably, the drive magnets 116 are permanent magnets, such as rare earth magnets like neodymium providing a very pronounced magnetic field strength. Integrating the passive drive magnets 116 in the driven body 110 significantly simplifies construction and operation of the drive device 100, since the rotor-type driven body 110 does not require wire connections with the electronic periphery. The drive magnets 116 are located at such positions within the driven body 110 that they interact with the magnetic drive field created by the drive coils 114. In other words, when an electric drive signal is applied to the drive coils 114, a magnetic field is created at the positions of the drive magnets 116. This magnetic field may generate a magnetic force acting on the drive magnets 116 to thereby force the drive magnets 116 to move, more specifically to rotate, together with the entire driven body 110. Hence, the drive coils 114 and the drive magnets 116 cooperate functionally to generate a force for moving the driven body 110 relative to the component carrier 102. More specifically, the driven body 110 according to FIG. 1 is configured as a rotor with embedded drive magnets 116. Mutual magnetic forces may be created between the powered drive coils 114 and the permanent magnetic drive magnets 116.

During operation of the drive device 100 according to FIG. 1, the component carrier 102 remains spatially fixed while the driven body 110 is rotated relative to the component carrier 102 due to the magnetic interaction between the powered drive coils 114 and the permanent magnetic drive magnets 116. For example, the drive device 100 may be configured to act as a motor or as an electric break or a mechanical load.

As shown as well in FIG. 1, an electronic component 118 (for instance a semiconductor chip or a sensor) may be embedded in (or alternatively surface mounted on) the stack 132 of the driven body 110. The electronic component 118 may be arranged relative to the drive coils 114 so that electromagnetic radiation created by the drive coils 114 may be captured for example by an antenna (not shown) of or connected to the electronic component 118. The electromagnetic energy captured by the antenna in a wireless way may be converted by an energy converting electric circuitry (not shown) of or connected to the electronic component 118 into electrical energy which may be used for powering the electronic component 118 without the need of a wired energy supply of the driven body 110 from an exterior side. In other words, the embedded electronic component 118 may be configured for extracting operation energy from the electromagnetic drive field and may thus operate autonomously. For instance, an external force may spin the rotor (i.e., the driven body 110) and may supply the stator circuitry. It may also be possible that an electronic component 118 (such as a semiconductor) embedded in the rotor or driven body 110 is supplied when the configuration acts as a motor.

Advantageously, the driven body 110 is arranged entirely in the cavity 112 or extends only partially beyond the cavity 112 so as to obtain a drive device 100 being highly compact in a vertical direction. Apart from a below described drive shaft 130, the entire drive device 100 is plate-shaped and can therefore even be accommodated under spatially confined conditions in the vertical direction.

As shown as well in FIG. 1, the drive device 100 comprises a central drive shaft 130 extending vertically and extending through both the horizontal plate-shaped component carrier 102 and the horizontal plate-shaped driven body 110. The drive shaft 130 is fixedly connected to the driven body 110 by a fastening member 142 for rotating together with the driven body 110 during operation of the drive device 100. Furthermore, the drive shaft 130 is rotatably mounted on the component carrier 102 via a bearing 120. As a result, the drive shaft 130 is configured to rotate together with the driven body 110 relative to the stationary component carrier 102. For example, the bearing 120 may be connected by a press fit connection with the component carrier 102 in a way to enable the drive shaft 132 to rotate relative to the component carrier 102. Hence, the drive device 100 comprises the shown central bearing 120 by which the driven body 110 is rotatably mounted on the component carrier 102. A rotating motion of the drive shaft 130 together with the driven body 110 relative to the stator-type component carrier 100 is indicated by reference sign 136. Hence, the drive device 100 according to FIG. 1 is configured to provide torque to the drive shaft 130. The drive shaft 130, in turn, can be connected with an exterior entity (not shown) for supplying the latter with torque or rotation energy.

Figure 2:
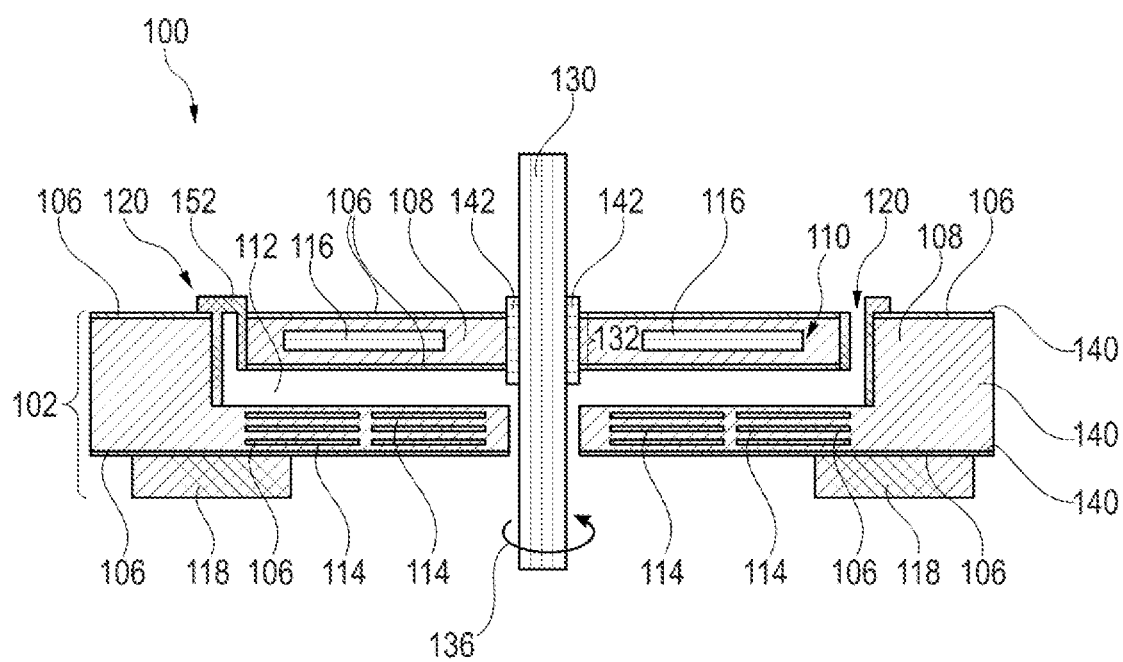
FIG. 2 illustrates a drive device providing torque by magnetically rotating a driven body arranged within a cavity of a component carrier according to another exemplary embodiment of the invention, wherein the component carrier and the driven body are mechanically coupled by a friction bearing with vertical movement lock.

FIG. 2 illustrates a drive device 100 providing torque by magnetically rotating a driven body 110 arranged within a cavity 112 of a component carrier 102 according to another exemplary embodiment of the invention.

The embodiment of FIG. 2 differs from the embodiment of FIG. 1 in that, according to FIG. 2, bearing 120 is configured for operating with a lateral bearing force exerted at facing sidewalls of the component carrier 102 and the driven body 110 accommodated in the cavity 112 of the component carrier 102. As shown, the component carrier 102 and the driven body 110 are mechanically coupled by a friction bearing 120 having a vertical locking mechanism 152 (which may be denoted as z-lock, i.e., as a lock in the vertical z-direction). In other words, the bearing 120 is configured for disabling a mutual vertical motion between driven body 110 and component carrier 102. For instance, friction bearing 120 may be formed of a fixed, non-moving bearing surface (such as machined metal or pressed-in bushing) that provides a low-friction support surface for the rotating (or in the embodiment of FIG. 4 sliding) surfaces of the component carrier 102 and the driven body 110. For instance, such a friction bearing 120 may use lubricating oil to separate the moving driven body 110 from the mated non-moving bearing surface of the component carrier 102.

Furthermore, the entire driven body 110 of FIG. 2 consists of passive members only and neither requires to be powered nor to be connected by electric cables, wires, etc.

Figure 3:
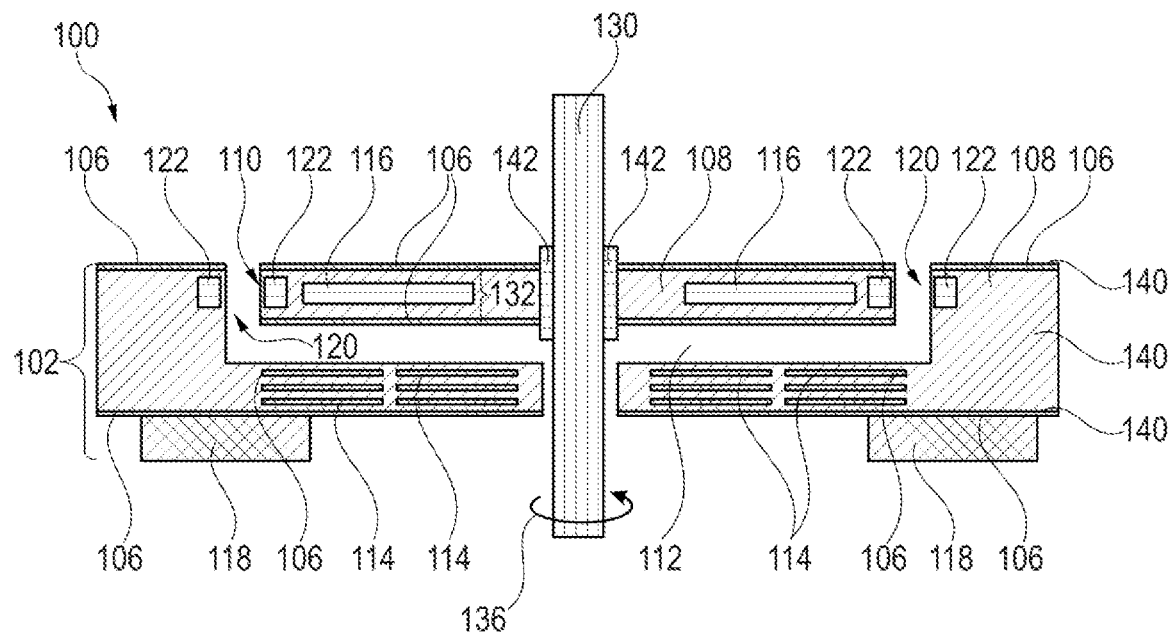
FIG. 3 illustrates a drive device providing torque by magnetically rotating a driven body arranged within a cavity of a component carrier according to still another exemplary embodiment, wherein the component carrier and the driven body are mechanically coupled by a laterally operating magnetic bearing.

FIG. 3 illustrates a drive device 100 providing torque by magnetically rotating a driven body 110 arranged within a cavity 112 of a component carrier 102 according to yet another exemplary embodiment of the invention, wherein the component carrier 100 and the driven body 110 are mechanically coupled by a magnetic bearing 120.

The embodiment of FIG. 3 differs from the embodiment of FIG. 2 in that, according to FIG. 3, bearing 120 is a magnetic bearing comprising cooperating permanent magnetic bearing magnets 122 in the component carrier 102 and in the driven body 110. As first group of bearing magnets 122 is embedded in the component carrier 102, whereas a second group of bearing magnets 122 is embedded in the driven body 110. The bearing magnets 122 of the first and second groups are here configured to generate a mutually attractive magnetic force. Cooperating pairs of bearing magnets 122 are provided on opposing sides of an interface gap spacing laterally the component carrier 102 with respect to the driven body 110. In other words, the interface gap corresponds to a lateral spacing between the component carrier 102 and the driven body 110 and equals to the part of the cavity 112 which surrounds the driven body 110 circumferentially and remains unfilled with the driven body 110. By the attractive magnetic forces between cooperating pairs of bearing magnets 122 facing opposing sides of the driven body 110, the driven body 110 remains centered in the cavity 112, and its rotating motion is guided by the bearing 120. Advantageously, the magnetic bearing 120 according to FIG. 3 is substantially friction free and thereby allows for an efficient and low loss rotation of the drive shaft 130 with respect the component carrier 102.

Figure 4:
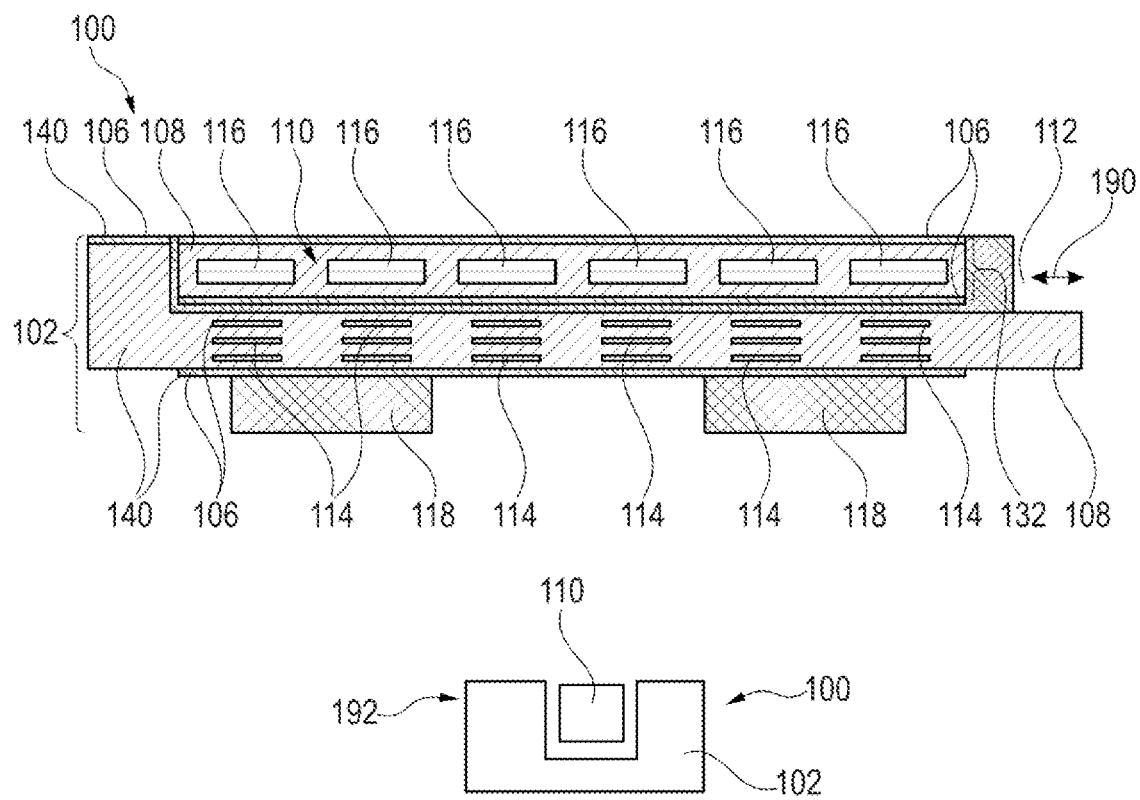
FIG. 4 illustrates a drive device providing a linear force by magnetically linearly moving or reciprocating a driven body arranged within a cavity of a component carrier according to yet another exemplary embodiment of the invention.

FIG. 4 illustrates a drive device 100 providing a linear force by magnetically linearly moving or reciprocating a driven body 110 arranged within a cavity 112 of a component carrier 102 according to still another exemplary embodiment of the invention. According to FIG. 1, cavity 112 has a lateral opening, more specifically an opening on a right-hand side.

The embodiment of FIG. 4 differs from the embodiment of FIG. 1 to FIG. 3 in particular in that, according to FIG.

4, the driven body 110 is configured for being driven to move linearly relative to the stationary component carrier 102. More specifically, the drive device 100 according to FIG. 4 may be operated to force the driven body 110 to reciprocate, i.e., to repeatedly move from left to right and back to the left according to FIG. 4 (the arrow 190). Hence, rather than providing torque, the driven body 110 may provide a longitudinal force to an external entity (not shown in FIG. 4). Thus, the driven body 110 may be configured to temporarily move out of the cavity 112 for mechanically actuating the external entity, when said force for longitudinally moving the driven body 110 relative to the component carrier 102 is exerted.

Preferably, the drive device 100 according to FIG. 4 may be configured so that the sliding motion of the driven body 110 relative to the stationary component carrier 102 may be a low friction motion. For instance, an air gap may remain in a vertical direction between the driven body 110 and the component carrier 102, and a repulsive magnetic force between permanent magnets (not shown in FIG. 4) in the driven body 110 and in the component carrier 102 may maintain a low friction spacing between the driven body 110 and the component carrier 102.

In the embodiment of FIG. 4, the driven body 110 may for instance be a rod which may press on, may displace or may drive an external entity. For example, the embodiment of FIG. 4 may drive a reciprocating piston of a piston pump. Alternatively, the embodiment of FIG. 4 may be operated as a linear motor. A side view of the drive device 100 according to FIG. 4 is shown schematically with reference sign 192, wherein the driven body 110 may move out of or into the paper plane of FIG. 4.

Figure 5:
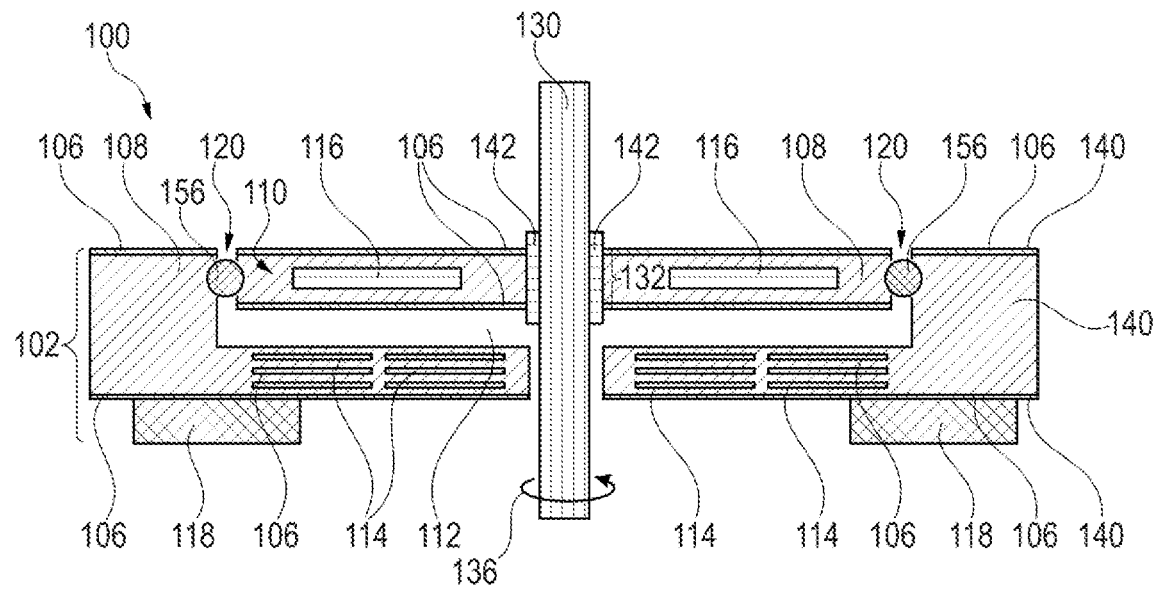
FIG. 5 illustrates a drive device providing torque by magnetically rotating a driven body arranged within a cavity of a component carrier according to still another exemplary embodiment of the invention, wherein the component carrier and the driven body are mechanically coupled by a ball bearing.

FIG. 5 illustrates a drive device 100 providing torque by magnetically rotating a driven body 110 arranged within a cavity 112 of a component carrier 102 according to yet another exemplary embodiment of the invention, wherein the component carrier 102 and the driven body 110 are mechanically coupled by a ball bearing 120.

The embodiment of FIG. 5 differs from the embodiment of FIG. 3 in that, according to FIG. 5, bearing 120 is a mechanical bearing configured as ball bearing (more specifically rolling contact bearing). A respective ball (or roller) bearing 120 may be arranged on the outer edge of the rotor-type driven body 110. Balls 156 or other rolling bodies may be accommodated in matching recesses formed in a lateral sidewall of the driven body 110 and in an inner sidewall of the recessed component carrier 102 for enabling a low friction rotation of the driven body 110 relative to the stationary component carrier 102.

Figure 6:
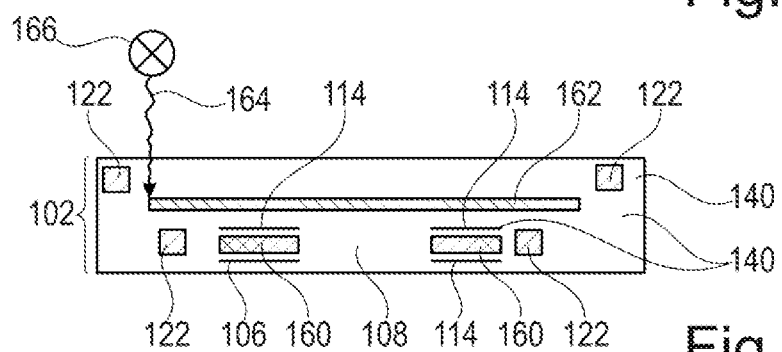
FIG. 6, FIG. 7 and FIG. 8 illustrate cross-sectional views of structures obtained during manufacturing a drive device according to an exemplary embodiment of the invention.
Figure 7:
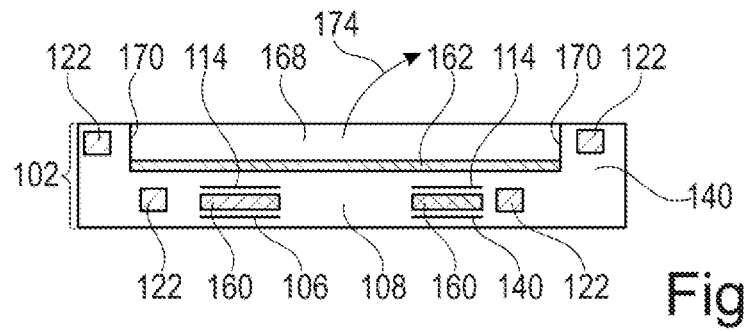
Figure 8:
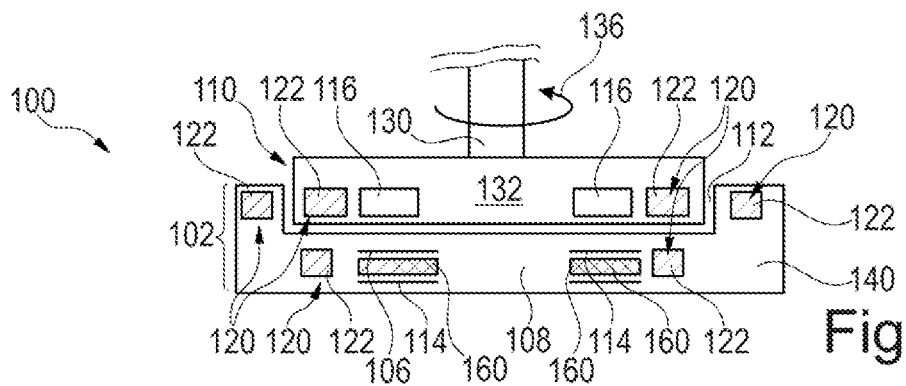

FIG. 6 to FIG. 8 illustrate cross-sectional views of structures obtained during manufacturing a drive device 100 according to an exemplary embodiment of the invention.

Referring to FIG. 6, a cross-sectional view of a component carrier 102 is shown which comprises laminated layer stack 140 having electrically conductive layer structures 106 and electrically insulating layer structures 108. Furthermore, drive coils 114 for creating a magnetic drive field are embedded in the stack 140 and form part of the electrically conductive layer structures 106, as described above. Furthermore, bearing magnets 122 are embedded as inlays in the component carrier 102.

In addition to that, ferromagnetic structures 160 (for instance ferromagnetic inlays) are embedded in the stack 140 so as to be arranged in an interior of the drive coils 114. For instance, the ferromagnetic structures 160 may be made of soft magnetic materials such as ferrite. Descriptively speaking, the ferromagnetic structures 160 may enhance the magnetic function of the drive coils 114, i.e., may enhance their function as electromagnets.

As shown as well in FIG. 6, a poorly adhesive structure 162 may be embedded in the stack 140. The poorly adhesive structure 162 may be made of a material (such as polytetrafluoroethylene (PTFE) or a waxy material) which does not properly adhere to the surrounding material of the stack 140. The poorly adhesive structure 162 may also be denoted as a release layer because it defines an area inside of the stack 140 at which different portions of the stack 140 may be separated or released.

Still referring to FIG. 6, a laser beam 164 created by a laser source 166 (or a mechanical drill bit, not shown) may be used for carrying out a circumferential cut from an exterior of the stack 140 extending up to the poorly adhesive structure 162.

As shown in FIG. 7, the above-mentioned circumferential cut may isolate a piece 168 from the rest of the stack 140. The piece 168 is laterally delimited by a circumferential cutting line 170, and is delimited at a bottom side by the poorly adhesive structure 162. Consequently, the piece 168 may be removed from the rest of the stack 140 by simply taking it out, as shown by an arrow 174. Hence, a cavity 112 is formed by embedding the poorly adhesive structure 162 in the stack 140 and by circumferentially cutting out and taking out piece 168 of the stack 140, said piece 168 being delimited at a bottom side by the poorly adhesive structure 162.

Referring to FIG. 8, cavity 112 is formed in the stack 140 by taking out the piece 168. Optionally, the poorly adhesive structure 162 may then be removed, for instance by rinsing or etching.

Thereafter, a driven body 110 may be placed in the cavity 112. As described above, the component carrier 102 in functional cooperation with the driven body 110 and the drive shaft 130 allows the driven body 110 for being driven to rotate together with drive shaft 130 relative to the component carrier 102 by exciting the drive coils 114 with an electric signal.

According to FIG. 8, magnetic bearing 120 is configured for operating with both a horizontal and a vertical bearing force. The vertical bearing force is created by the bearing magnets 122 of the component carrier 102 and of the driven body 110, which bearing magnets 122 are arranged above each other. Said bearing magnets 122 may generate a mutually repulsive magnetic force so as to maintain a vertical gap between the component carrier 102 and the driven body 110.

It should be noted that the term "comprising" does not exclude other elements or steps and the article "a" or "an" does not exclude a plurality. Also, elements described in association with different embodiments may be combined.

Implementation of the invention is not limited to the preferred embodiments shown in the figures and described above. Instead, a multiplicity of variants is possible which use the solutions shown and the principle according to the invention even in the case of fundamentally different embodiments.

The invention claimed is:
1. A drive device, comprising:
   a component carrier which comprises a stack comprising
      at least one electrically conductive layer structure and/or at least one electrically insulating layer structure and
      a cavity formed in the stack;

a driven body arranged at least partially in the cavity and configured for being drivable to move relative to the component carrier, wherein the driven body is plate-shaped;

at least one drive coil for creating a magnetic drive field;

at least one drive magnet arranged for interacting with the magnetic drive field created by the at least one drive coil to thereby generate a force for moving the driven body relative to the component carrier;

wherein one of the at least one drive magnet and the at least one drive coil forms part of the component carrier and the other one of the at least one drive magnet and the at least one drive coil forms part of the driven body.

2. The drive device according to claim 1, wherein the at least one drive coil forms part of the component carrier and the at least one drive magnet forms part of the driven body.

3. The drive device according to claim 1, wherein at least part of the at least one drive coil forms part of the at least one electrically conductive layer structure.

4. The drive device according to claim 1, wherein the at least one drive coil is embedded and/or formed in the component carrier.

5. The drive device according to claim 1, wherein the at least one drive magnet is embedded in the driven body.

6. The drive device according to claim 1, wherein the driven body includes substantially parallel opposing main surfaces adjacent to the at least one drive magnet and the at least one drive coil forming part of the driven body.

7. The drive device according to claim 1, wherein the driven body is configured for being driven to rotate relative to the component carrier.

8. The drive device according to claim 1, wherein the driven body is configured for being driven to move linearly, to reciprocate, relative to the component carrier.

9. The drive device according to claim 1, wherein the at least one drive magnet is a permanent rare earth magnet.

10. The drive device according to claim 1, comprising at least one of the following features:

wherein the driven body is arranged entirely in the cavity or partially extends beyond the cavity;

wherein the driven body is configured to temporarily move at least partially out of the cavity, for mechanically actuating an external entity, when said force for moving the driven body relative to the component carrier is exerted;

at least one component on and/or in the driven body and being configured for generating electric operation energy based on the magnetic drive field.

11. The drive device according to claim 1, further comprising:

at least one bearing by which the driven body is movably mounted on the component carrier, wherein when the at least one bearing comprises a mechanical bearing the mechanical bearing is in the component carrier.

12. The drive device according to claim 11, comprising at least one of the following features:

wherein the at least one bearing comprises a magnetic bearing comprising cooperating attractive, bearing magnets of the component carrier and of the driven body;

wherein the at least one bearing comprises a mechanical bearing or a friction bearing;

wherein the at least one bearing is configured for disabling a mutual vertical motion between driven body and component carrier;

wherein at least one of the at least one bearing is configured for acting laterally;

wherein at least one of the at least one bearing is configured for acting vertically.

13. The drive device according to claim 1, comprising at least one of the following features:

wherein windings of the at least one drive coil are circumferential horizontal electrically conductive structures being vertically stacked within the component carrier and being interconnected by vertical electrically conductive structures;

comprising a drive shaft extending through the component carrier and through the driven body and being configured for moving together with the driven body and relative to the component carrier;

wherein the cavity has an opening on at least one side.

* * * * *